(12) United States Patent
Schaper et al.

(10) Patent No.: US 6,353,209 B1
(45) Date of Patent: Mar. 5, 2002

(54) TEMPERATURE PROCESSING MODULE

(75) Inventors: Charles D. Schaper, Union City; Khalid El-Awady, Mtn. View; Thomas Kailath, Stanford, all of CA (US)

(73) Assignee: Board of Trustees of the Leland Stanford Junior University

( * ) Notice: Subject to any disclaimer, the term of this patent is extended or adjusted under 35 U.S.C. 154(b) by 0 days.

(21) Appl. No.: 09/457,907

(22) Filed: Dec. 8, 1999

Related U.S. Application Data

(60) Provisional application No. 60/122,797, filed on Mar. 4, 1999.

(51) Int. Cl.[7] ............................. H05B 3/68; C23C 16/00
(52) U.S. Cl. ................................. 219/444.1; 118/725
(58) Field of Search ..................... 219/443.1, 444.1, 219/446.1; 118/724, 725, 728, 729, 730; 165/80.2, 80.4

(56) References Cited

U.S. PATENT DOCUMENTS

| | | | |
|---|---|---|---|
| 4,518,848 A | * 5/1985 | Weber | 219/444.1 |
| 5,431,700 A | 7/1995 | Sloan et al. | 29/25.01 |
| 5,802,856 A | 9/1998 | Schaper et al. | 62/3.7 |
| 5,851,298 A | * 12/1998 | Ishii | 219/444.1 |
| 5,854,468 A | * 12/1998 | Muka | 219/444.1 |
| 5,974,682 A | * 11/1999 | Akimoto | 118/724 |
| 6,097,005 A | * 11/1999 | Akimoto | 475/5 |
| 6,072,163 A | 6/2000 | Armstrong et al. | 219/497 |
| 6,107,608 A | * 8/2000 | Hayes | 219/444.1 |
| 6,121,579 A | * 9/2000 | Aoki et al. | 219/444.1 |

FOREIGN PATENT DOCUMENTS

DE   WO 00/51170   8/2000

* cited by examiner

*Primary Examiner*—Sang Paik
(74) *Attorney, Agent, or Firm*—Lumen Intellectual Property Service, Inc.

(57) ABSTRACT

A module for thermally processing a substrate has a plurality of thermally-conductive heating elements supported in position within a plane. Resistive heaters in the form of cartridge heaters are in thermal contact with the heating elements. Multiple zones are enabled by physical separation of the heating elements that constitute the thermal processing plate. A cooling plate is positioned in proximity to the backside of the heating elements and can be driven into thermal contact with the upper heated plate when cooing is desired.

24 Claims, 10 Drawing Sheets

TEMPERATURE PROCESSING MODULE

CROSS-REFERENCE TO RELATED APPLICATIONS

This application is based on Provisional Application 60/122,797 filed Mar. 4, 1999, which is herein incorporated by reference.

STATEMENT REGARDING FEDERALLY SPONSORED RESEARCH OR DEVELOPMENT

This invention was made in part with Government support under contract F49620-85-L-0525 awarded by the Air Force Office of Scientific Research. The Government has certain rights in this invention.

TECHNICAL FIELD OF THE INVENTION

This invention relates generally to thermal processing of semiconductor substrates including wafers, quartz reticles and LCD flat panel displays. More particularly, it relates to an integrated procedure of baking and subsequently chilling a substrate coated with photoresist.

BACKGROUND

The lithography processing sequence for producing integrated circuit lines on semiconductor substrates such as semiconductor wafers, quartz photomask blanks, and LCD flat panel displays, involves coating the substrate with a thin photoresist film. The film is subsequently exposed according to a predefined pattern by an electron beam or optical tool and then chemically developed to produce integrated circuit features. Several of the photoresist processing steps consist of baking the photoresist-coated substrate and then chilling it back to ambient conditions. The bake step is performed for several applications including evaporation of solvent, removal of standing wave effects, hardening of the photoresist, and accelerating chemical reactions for acid catalyzed photoresist. In order to achieve uniform processing, it is essential that spatial temperature variations are minimal throughout the entire trajectory.

The conventional manner of performing the baking and chilling of a substrate is shown in FIG. 1. An apparatus 20 includes a substrate 10 placed on a typically fixed-temperature hot plate 22, where it is heated up to a temperature typically between 70° C. and 250° C. for a period of time typically between 3 and 8 minutes for quartz photomask substrates and 30 and 120 seconds for a semiconductor wafer. The transient time, or time it takes the substrate to reach its steady-state processing temperature, is substantially longer for a quartz photomask blank than a semiconductor wafer because of its larger thermal mass (a typical quartz blank is 6 inches square by 0.25 inches thick, whereas a semiconductor wafer is 8 or 12 inches in diameter and less than 0.040 inches thick). After the substrate reaches its processing temperature and is held for a predetermined time, it is then mechanically moved to a fixed-temperature cold plate 24, where it is chilled to a temperature typically between 0 and 30° C.

There are several disadvantages to this method of processing substrates. First, the movement of the substrate through the air from the hot plate 22 to the cold plate 24 causes the substrate to experience uncontrolled and nonuniform temperature fluctuations that persist during the entire cool down step. Second, uncontrolled temperature nonuniformities during the bake or chill steps may arise due to nonuniform convection currents over the substrate, especially with a square geometry of a quartz photomask substrate or a large 300 mm diameter of a silicon wafer. Third, the time required to move the substrate between the plates prevents the realization of very short thermal transition times between the bake and chill steps. Fourth, the procedure requires two distinct processing modules leading to an increased equipment footprint and the inability to integrate the module within other processing modules, such as the exposure tool. Fifth, the mechanical movement of the hot substrate between the plates may contaminate or otherwise damage the substrate. Sixth, the substrate is initially placed on a hot plate thereby making inaccuracies of the substrate's temperature lowering mechanism inducing temperature nonuniformities that persist during the entire heating transient when one part of the substrate comes into proximity with the cold plate before another.

Referring to FIG. 2, a prior photoresist processing system 30 for silicon wafers, described in U.S. Pat. No. 5,431,700 by Sloan, discloses an apparatus where one of the plates, e.g., the hot plate 32 is placed upside down and directly above the other plate, e.g., cold plate 34. A lifting mechanism moves the substrate 10 only a short distance between the two plates. This approach reduces the nonuniform temperature induced by the wafer movement. However, the substrate still needs to be placed on constant temperature plates and the movement of the substrate is still required leading to nonuniform temperature deviations.

Referring to FIG. 3, another prior art photoresist processing system 40, described in U.S. Pat. No. 5,802,856 and incorporated herein by reference, includes a single integrated bake/chill plate 42. A passage is formed through the plate 42. To raise the temperature of the substrate 10, a hot fluid (e.g. between 70° C. and 250° C.) from a hot fluid supply 46 is introduced through passage 44 via a pipe 45. To lower the temperature of the substrate 10, cold fluid (e.g. between 0° C. and 30° C.) from a cold fluid supply 48 is introduced through passage 44. This system includes a resistive heat device 49 on the surface of the unit to improve temperature transients and steady-state holds. The resistive heater may be configured in a multizone arrangement to achieve improved temperature nonuniformity.

This system 40 eliminates the mechanical movement of the substrate during the temperature cycle and eliminates the placement of a cold substrate on a hot plate and vice versa. However, there are several disadvantages to the system. First, the entire apparatus is cycled in temperature. This procedure increases the energy requirements well beyond the theoretical minimum required to heat and cool the substrate. In addition, the hot fluid transportation through pipe 45 may pose a safety threat to personnel working close to the system in addition to nearby equipment that can become contaminated in case of a leak. Further, the fluid heat exchanger systems are bulky and expensive. In addition, the thin resistive heater placed on the surface of the exchanger, e.g. kapton, normally has operational limits of 200 to 250° C. that prevent the realization of higher operating temperatures.

OBJECTS AND ADVANTAGES OF THE INVENTION

It is a primary object of the present invention to provide an improved method and apparatus for the spatial temperature control of material substrates. The method and apparatus may include, but is not limited to, thermal cycling. Such material substrates are quartz photomask blanks and silicon wafers. In particular, it is an object of the present invention to provide a method and apparatus that reduces the energy requirements, provides exceptional multizone temperature control of the substrate, improves reliability and increases the upper limit on temperature processing. An additional advantage of the present invention is the reduction of thermal deflection of the heating elements because of the length to thickness aspect ratio of the heating elements. Further advantages of the invention will be apparent from the following description and drawings.

SUMMARY OF THE INVENTION

This invention is concerned with a module for the temperature control of a material substrate. The module includes a plurality of independent thermally-conductive heating elements arranged in a planar fashion. An air gap or other suitable resistive material separates each of the thermally-conductive heating elements. The upper surface of the thermally-conductive heating elements is in thermal contact with the substrate. The temperature of the thermally-conductive heating elements is raised by a resistive heating element in thermal contact with it. A support structure holds the thermally-conductive heating elements in a fixed position. A cooling plate may be located in close proximity to and in the backside of the thermally-conductive heating elements. In a preferred embodiment, the cooling plate may rest on top of the support structure, thereby maintaining the support structure at a cold temperature. If maximum cooling is desired, the cooling plate is raised by a lift mechanism to contact the backside of the thermally-conductive heating elements to lower the substrate temperature. Alternatively, because the support structure is itself in thermal contact with the thermally-conductive heating elements, cooling at appreciable ramp-down rates can also be achieved without having to move the cooling plate at all.

An embodiment of the invention may include the following. The thermally-conductive heating element may consist of aluminum pieces with square-shaped, 1-inch by 1-inch, heads that are 60 mils thick. The head is thermally and mechanically coupled to a shaft. The shaft is hollowed with a cartridge resistive heater embedded within the opening. The resistive heater may be coupled to the shaft with a thermally conducting adhesive bond. The thermally-conductive heating elements are mounted on a support structure and placed in close proximity to each other (e.g. 20 mils apart). This proximity distance improves the thermal separation between the heating elements. In this fashion, the thermally-conductive heating elements form a square array of providing highly localized and spatially variable quantities of heat. It is noted that the discontinuity of the thermally-conductive heating elements is satisfactory to limit the cross-sectional heat conduction. Therefore, a thermally-resistive gap, which may involve the thermally-conductive heating elements in contact, is sufficient to achieve the thermal isolation. The heaters of the thermally-conductive heating elements are connected to a plurality of power supplies to achieve independent control over the spatial temperature distribution of the substrate. In a preferred embodiment, each heater is connected to its own independent power supply.

If thermal cycling is desired, a cooling plate may be positioned below the thermal-conductive heating elements and resting on the top of the support structure. The cooling plate has holes that can coincide with the location and dimension of the shaft of the heating elements. Further, the cooling plate has a passage through which cooling fluid passes. The cooling plate may be connected to a lifting mechanism that allows movement in the vertical direction. When cooling of the thermally-conductive heating elements is desired, the resistive heaters can be lowered in power or turned off. Alternatively, for faster cooling rates, the cooling plate can be positioned into thermal contact with the bottom surface of the thermally conductive heating elements. Depending upon the desired degree of uniformity and ramp-down rate, the square heating elements may or may not be energized during the ramp-down.

In a preferred embodiment of the invention, temperature is measured at each of the thermally-conductive heating elements. A temperature sensing device, such as an RTD or thermocouple, is embedded within the upper portion of the thermally-conductive heating elements. The temperature measurements are fed back to a controller that adjusts the power supplies that manipulate the resistive heating elements. The same controller may also be used if the cooling plate is present and ramp-down is desired.

In another embodiment of the invention for processing round substrates, such as semiconductor wafers, the head of the thermally-conductive heating elements can be shaped in such a way as to form an array of concentric elements that are also separated angularly, forming sectors of independent control. In another embodiment, the array of thermally-conductive heating elements may be machined from a single material piece, and grooves cut into the top and/or bottom surfaces of the single material piece to effectively achieve a plurality of thermally-conductive heating elements. Alternative resistive heating devices other than cartridge heaters may be utilized as well, for example, etched-foil heating elements, thermoelectrics or resistive heating elements embedded within or adhered to the square heating piece with leads extending through the shafts of the thermally conductive heating elements.

DETAILED DESCRIPTION

The following is a description of a preferred embodiment of the invention. It will be obvious to anyone of ordinary skill in the art that the essential ideas and principles of the invention may be implemented in various substantially similar ways and that many of the following details can be altered to result in substantially the same results.

Figure 1:
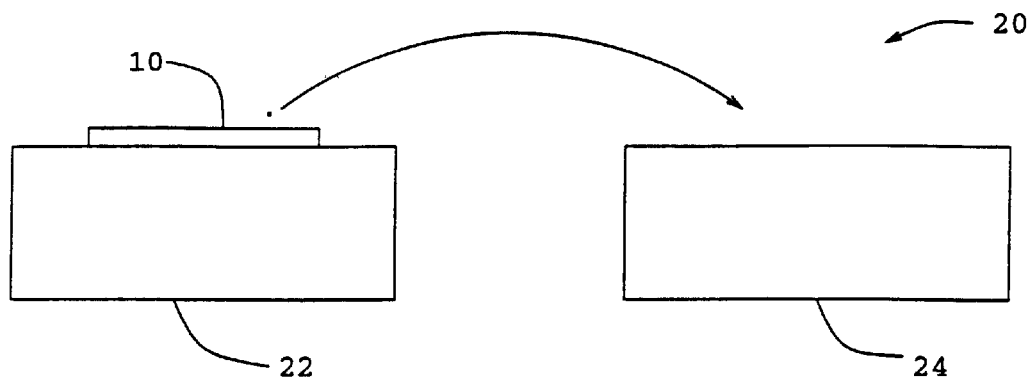
FIG. 1 illustrates a prior art photoresist processing method that involves horizontal movement of the substrate from a hot plate to a cold plate.
Figure 2:
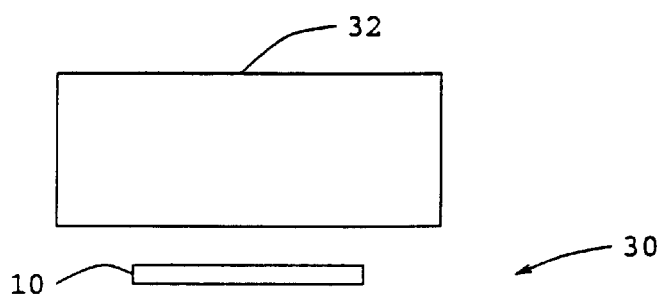
FIG. 2 depicts another prior art photoresist processing procedure of vertical movement of the substrate between a hot plate and a cold plate.
Figure 2:
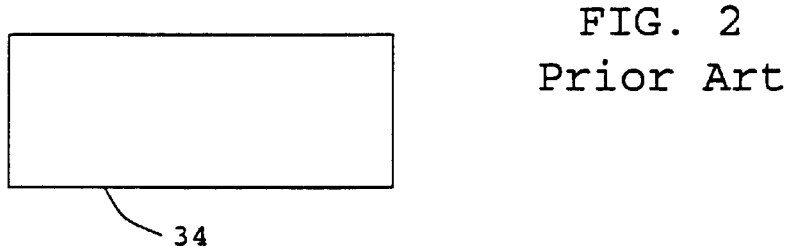
Figure 3:
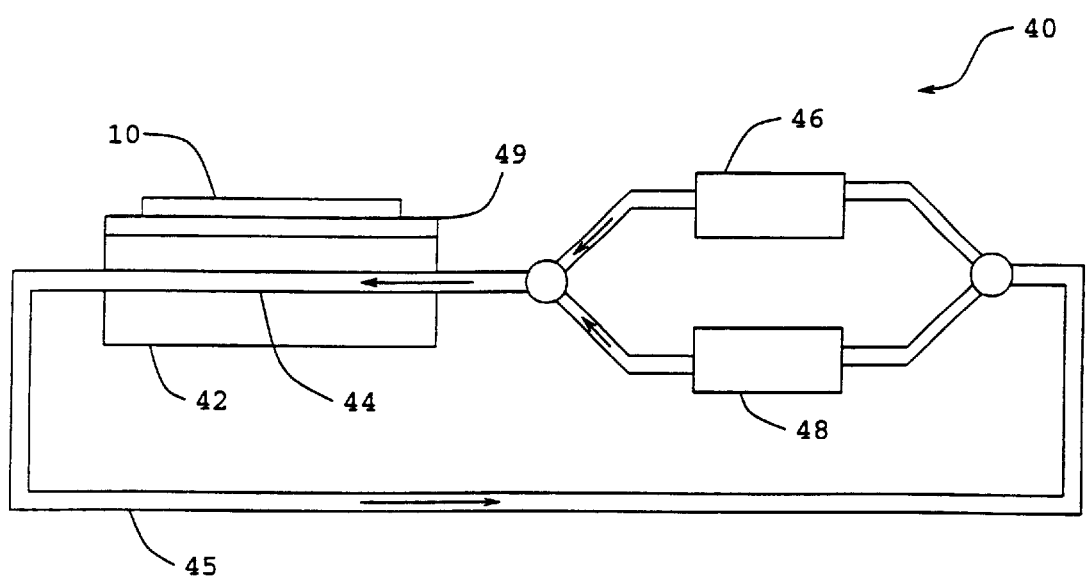
FIG. 3 illustrates a prior art photoresist processing procedure of thermally cycling the substrate by a combination of hot and cold fluid and resistive heating element.
Figure 4A:
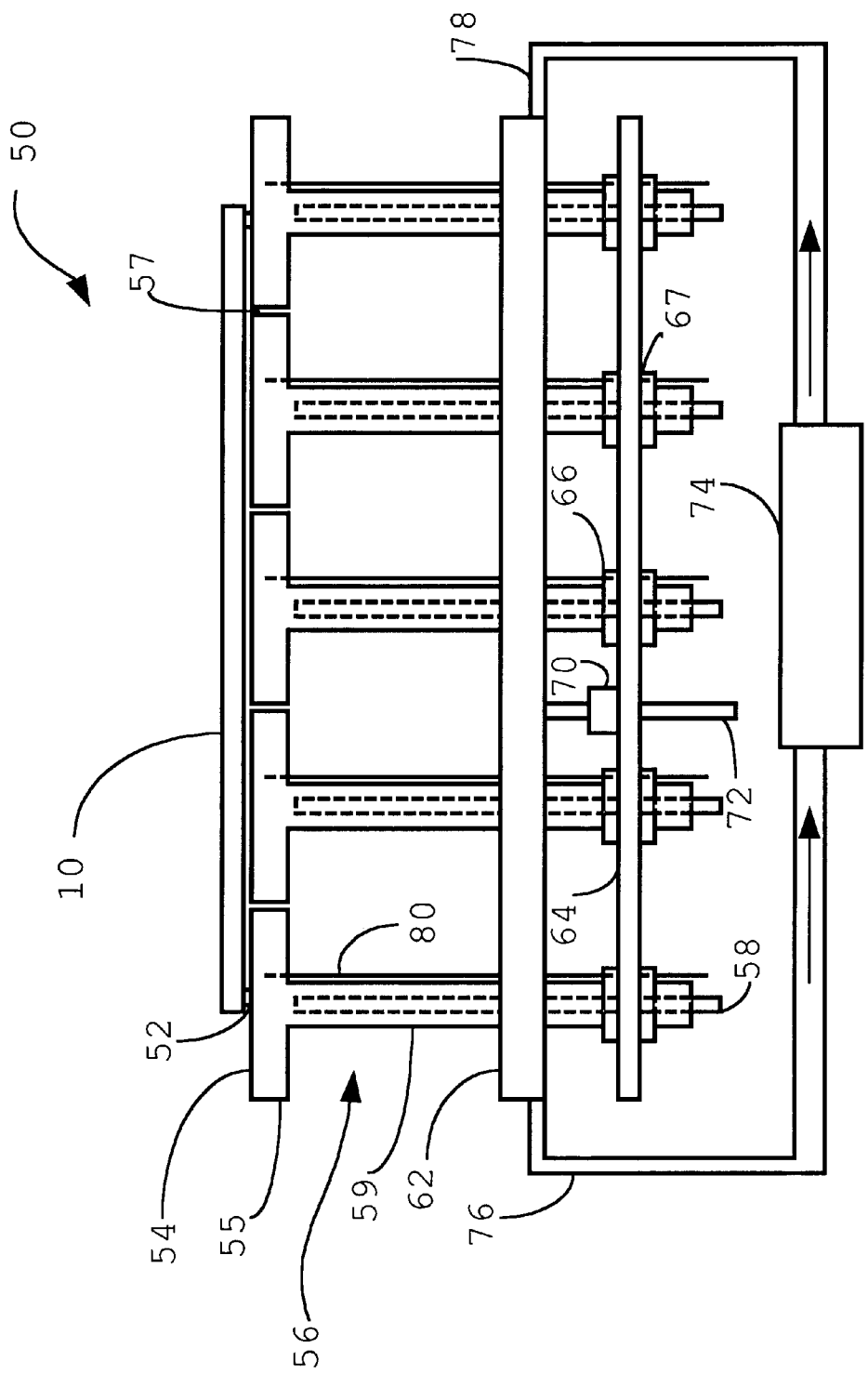
FIG. 4A is a cross-sectional view of the heating system according to a preferred embodiment of the invention with the cooling plate installed when thermal cycling is desired.

FIG. 4A shows a cross-sectional view of the thermal processing module 50. A substrate 10 rests on pins 52 and in thermal contact with the surface 54 of the square pieces 55 of thermally-conductive heating elements 56. The temperature of the thermally-conductive heating element 56 is controlled consequently through thermal contact, so is the temperature of the substrate 10. For the purposes of this description, thermal contact is defined to include physical proximity sufficient to permit the transfer of heat, direct physical contact, and indirect physical contact sufficient to permit the transfer of heat through an intervening element or medium.

Substrate 10 is preferably placed in thermal contact with surface 54 through physical proximity or through direct physical contact. Both methods of establishing thermal contact are well known in the art and typically include positioning the substrate approximately 0.1 mm from the plate, or holding the substrate directly against the plate with a vacuum line, electrostatic clamp, or gravity. In the preferred embodiment, substrate 10 is placed in thermal contact with surface 54 through physical proximity, although any of the known methods of thermal contact may also be used.

Thermal processing module 50 includes a plurality of thermally-conductive heating elements 56. Each thermally-conductive heating element 56 is made of a thermally conductive material, preferably aluminum, with a cartridge heater 58 embedded within the structure. In the preferred embodiment, the thermally-conductive heating element 56 includes a shaft 59. Each thermally-conductive heating element 56 is mounted by bolt 67 onto a support piece 64 with a flange 66 maintaining its position. This stationary support 64, preferably made of aluminum, provides a solid foundation for the thermally-conductive heating elements 56 and allows their precise fixed positioning relative to substrate 10. The thermally-conductive heating elements 56 are separated from each other by an air gap 57 or other thermally resistive material. The purpose of the air gap or resistive material is to prevent the conduction of energy between adjacent thermally-conductive heating elements 56. It also aids in minimizing out-of-plane thermal deflection of the thermally-conductive heating elements 56 due to axial temperature gradients through the surface of the head. An optional temperature sensor 80 is embedded or adhered within each thermally-conductive heating element 56 to measure its temperature.

Figure 4B:
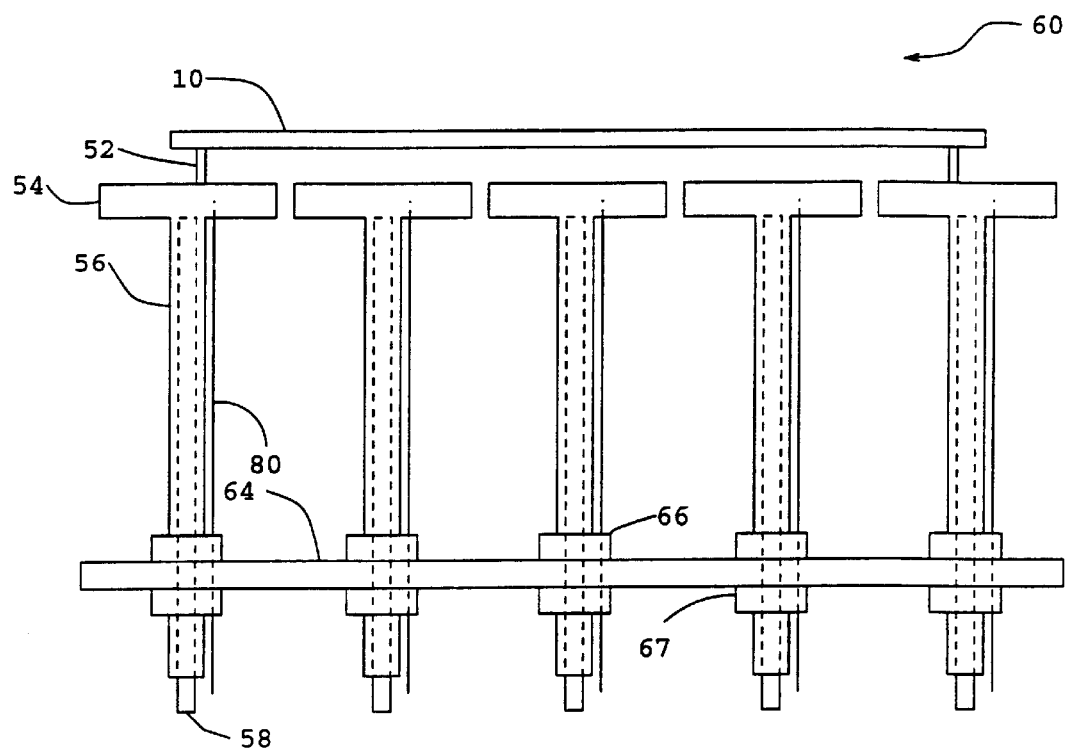
FIG. 4B is a cross-sectional view of the heating system according to a preferred embodiment of the invention.

In FIG. 4A, the chill mechanism of the heating system is present. A thermally conductive pad of suitable material and thickness, for example a 10 mil thick silicone pad, may be placed on either or both surfaces of the cooling plate 62 to aid in the equalization of pressure and conductive heat transfer between the cooling plate 62 and the thermally-conductive heating elements 56, as well as the support 64. Fluid flows through a passage in the cooling plate 62 from an inlet 76 and an outlet 78, originating from a cold fluid supply source 74. The cooling plate 62 can be moved in a vertical direction by the use of a motor 70 and a worm-screw assembly 72. The motor speed can be controlled in order to provide a soft landing between the cooling plate 62 and the base of the thermally-conductive heating elements 56. Similarly, an air actuated cylinder may be used to adjust the vertical position of the cooling plate 62. FIG. 4B depicts the thermal array system 60 without the cooling plate installed. This system is used when cooling is not required or desired.

Figure 5:
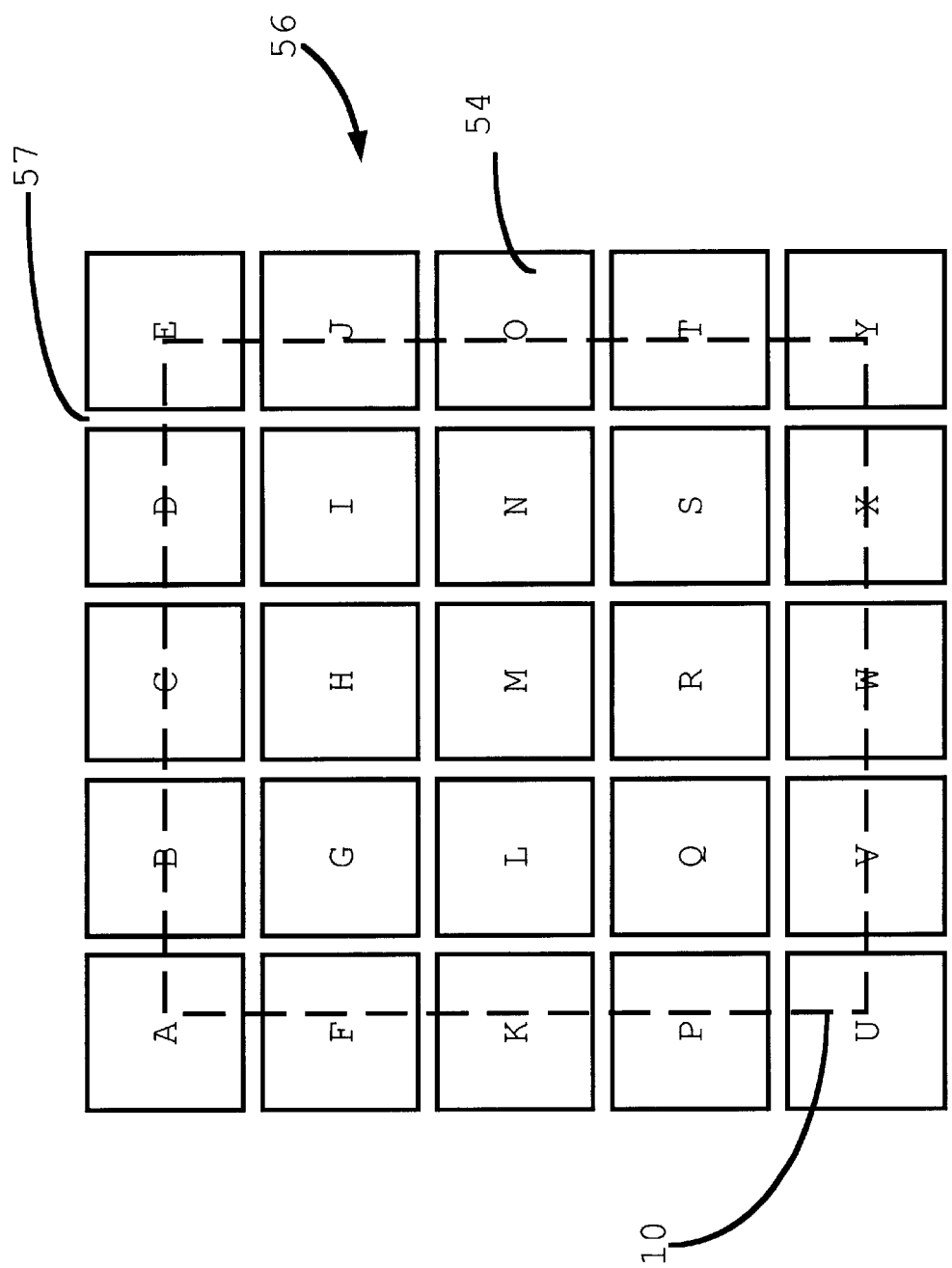
FIG. 5 depicts a top-down view of the heating element configuration.

FIG. 5 depicts a top-down view of the thermally-conductive heating elements 56 showing the multizone heating configuration. The array of thermally-conductive heating elements 56 is divided into twenty-five individual elements labeled A through Y. The heating elements are slightly separated by an air gap 57 to reduce cross-sectional thermal conductive energy transfer. Each of the resistive heaters 58 is electrically connected to its own individual variable power supply. In a preferred embodiment, each of the thermally-conductive heating elements 56 has its own sensor, heater, and feedback control electronics, all coordinated by a centralized controller. Alternatively, the thermally-conductive heating elements can be grouped into zones to reduce the number of power supplies needed to control the unit.

Figure 6:
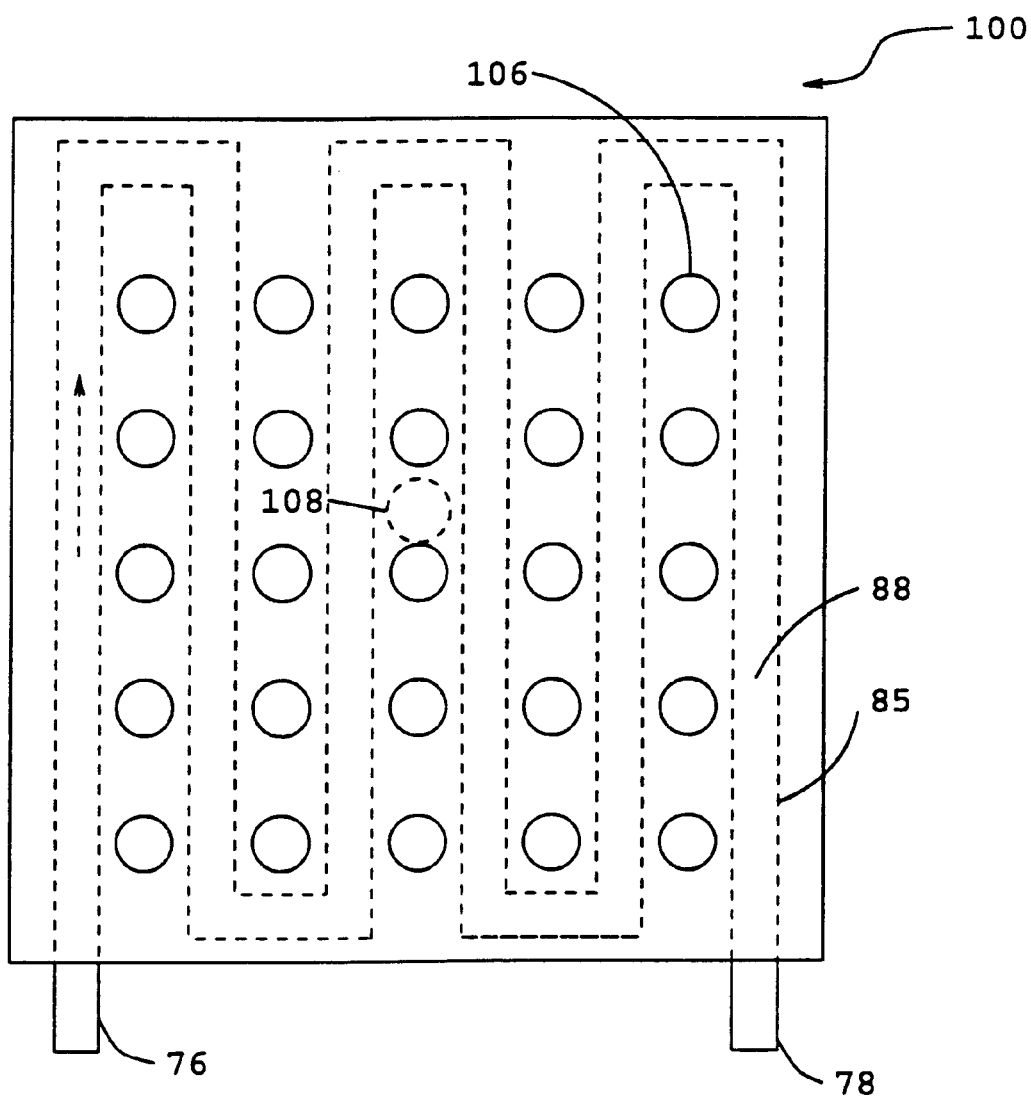
FIG. 6 depicts a top view of the cooling plate assembly.

FIG. 6 is a top-down view of the cooling plate 100. In the preferred embodiment, the cooling plate 100 has a single inlet port 78 and a single outlet port 76. A channel 88 connects the inlet and outlet ports. Fluid flows through the channel 88 defined by inner walls 85. Circular holes 106 permit the vertical movement of the cooling plate 100 without contacting the shaft 59 of the thermally-conductive heating elements 56. The diameter of the circular holes 106 is 20 mils larger than the maximum diameter of the shaft 59 of the thermally-conductive heating elements 56. A gear-screw thread 108 is installed through the cooling late 100 to allow for vertical movement of the cooling plate 100 toward the thermally-conductive heating elements 56. Alternative cooling passages are possible including multiple channels arranged in a counter current flow pattern. The advantage of countercurrent flow is better uniformity of temperature across the cooling plate when subjected to heat flux at the surface. Alternate methods of raising the cooling plate are also possible. In addition, the scheme of not raising the cooling plate at all is possible, which makes the gear-screw threads 108 are unnecessary.

Figure 7A:
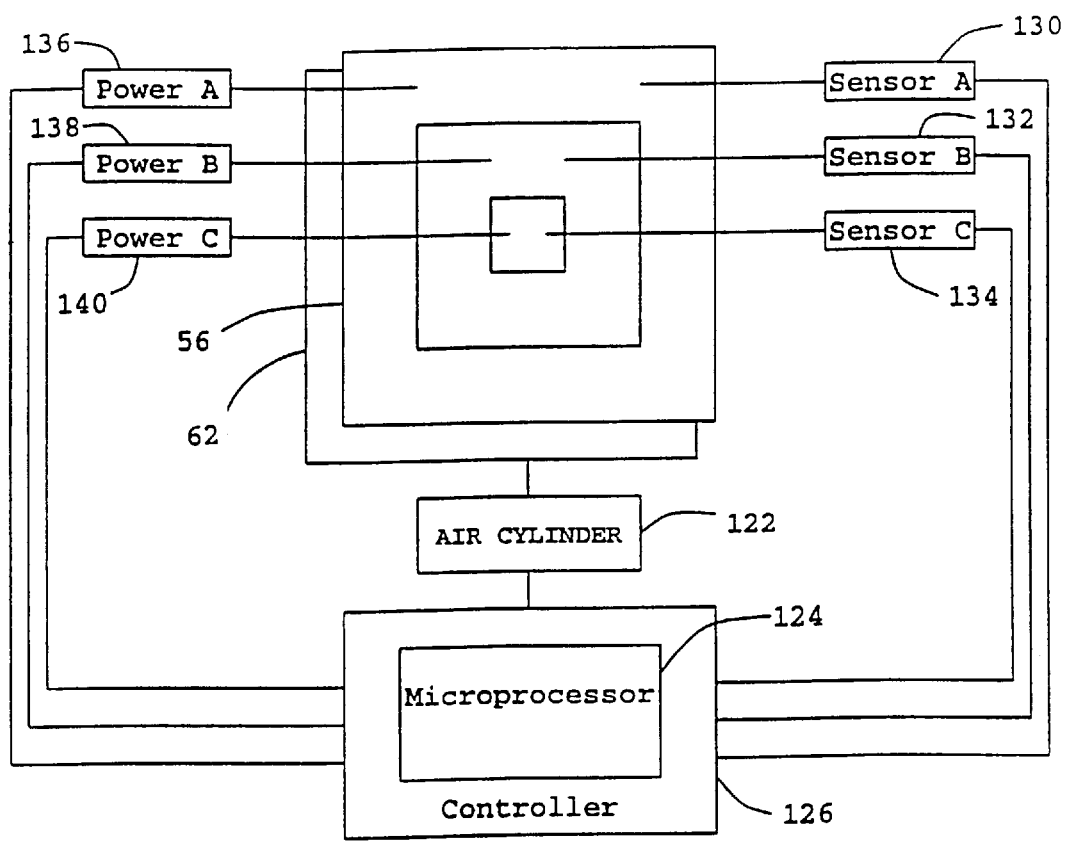
FIG. 7A depicts a schematic of the control system for the thermal cycling module for zoned configuration.
Figure 7B:
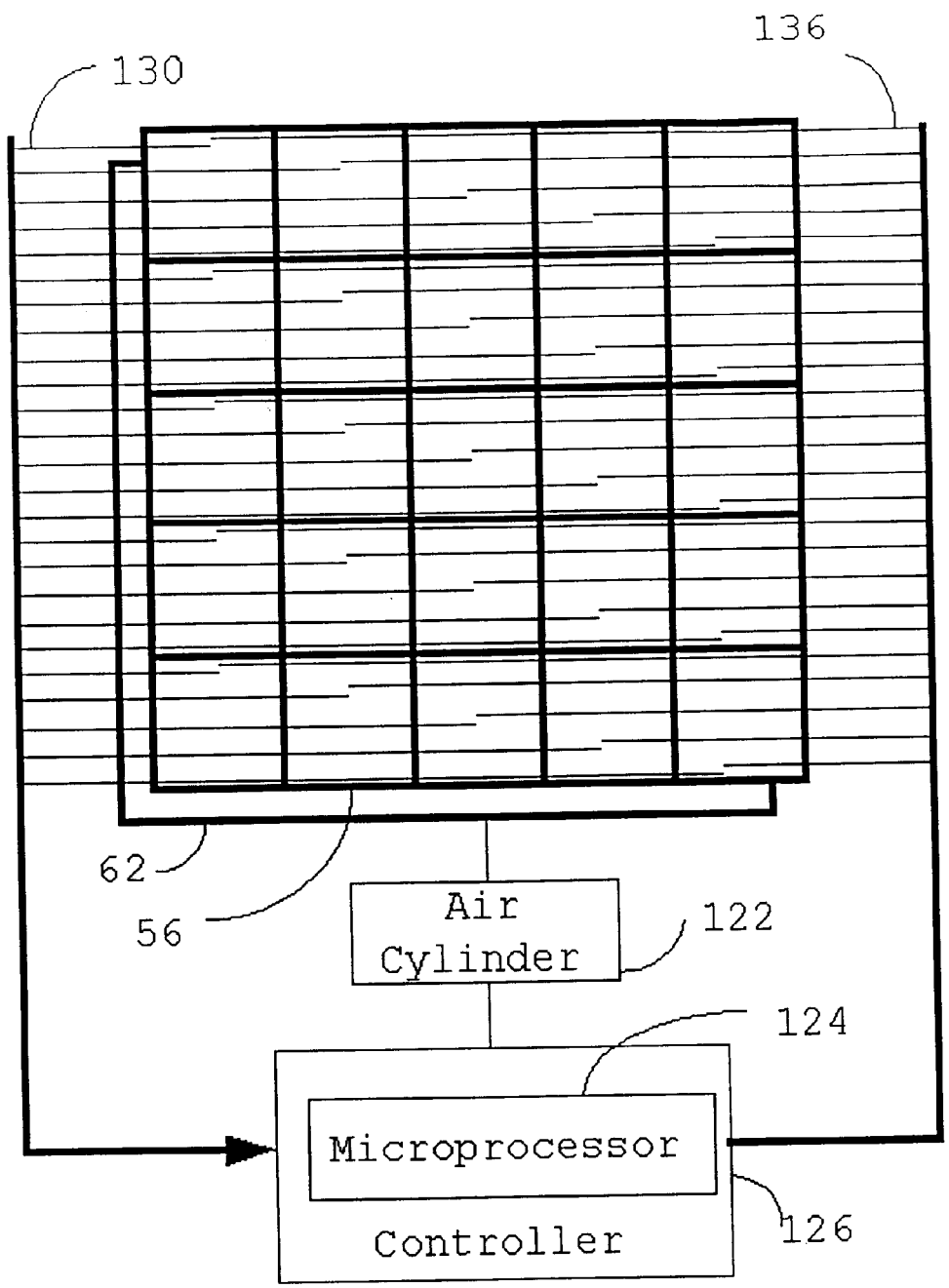
FIG. 7B depicts a schematic of the control system for the thermal cycling module for individualized thermally conductive heating element control.
Figure 7C:
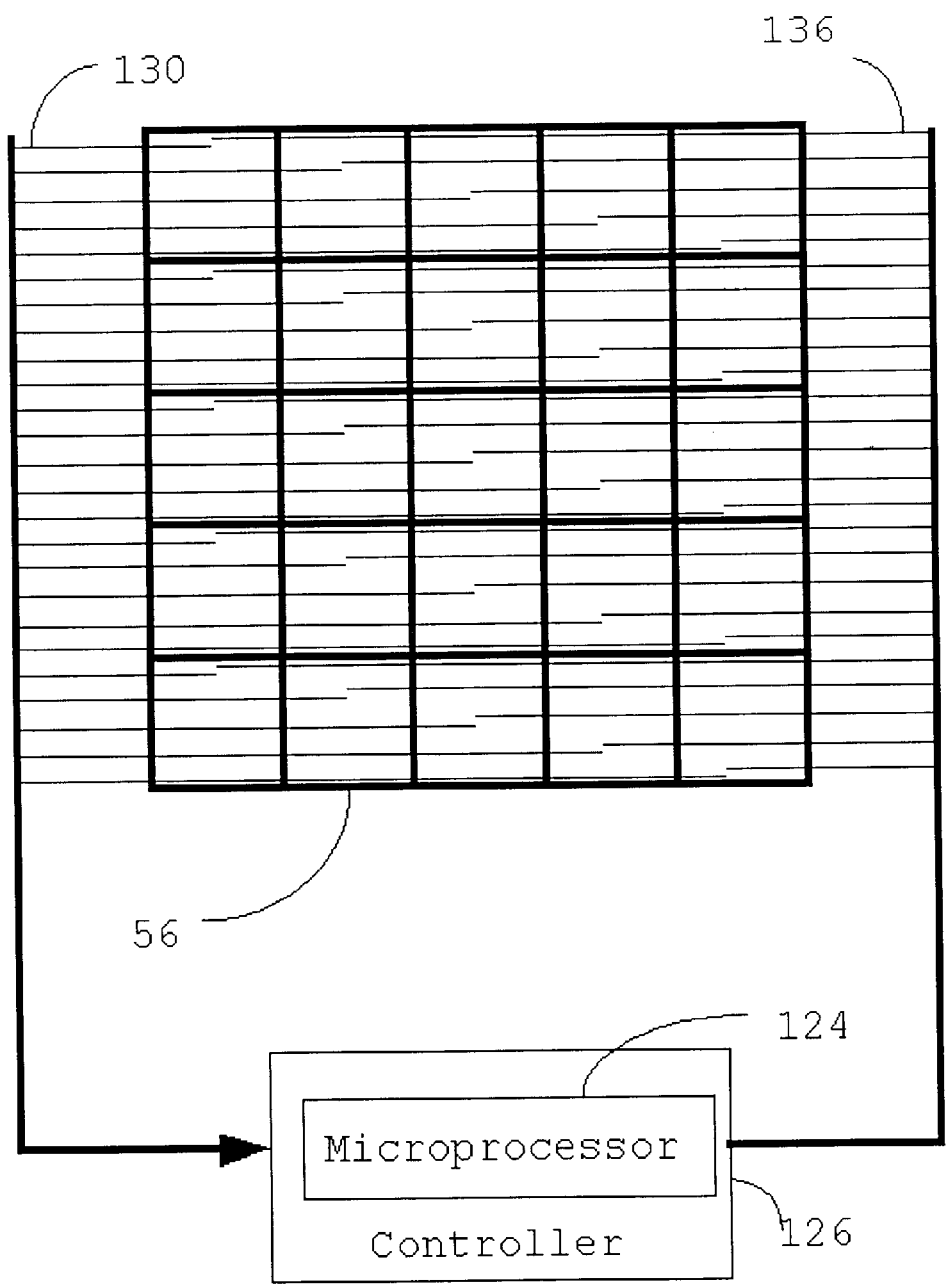
FIG. 7C depicts a schematic of the control system for a heating only implementation.

Referring to FIG. 7A, a schematic of the feedback control loop with three zones of thermally-conductive heating elements is depicted according to an embodiment. The thermally-conductive heating elements of each zone are connected in parallel electrically to a single power supply, thus receiving the same excitation. The feedback control loop is conceptually the same for the present displayed case and the preferred embodiment. The feedback control loop is used to regulate the substrate temperature during the thermal cycle. Sensors 130, 132, and 134 are connected electrically with a feedback controller 126. The sensors send to controller 126 electrical signals representative of substrate temperatures or process parameters of corresponding substrate regions. Each of the sensors may be a temperature sensor, such as an RTD, thermocouple or infrared (pyrometer) sensor. The preferred embodiment is to individually connect the sensors and heating elements and not to use zones, as described in FIG. 7B. The option of no cooling plate present is shown in FIG. 7C.

Sensors 130, 132 and 134 are positioned to sense particular temperatures and/or process parameters at specific regions of the substrate. For example, IR sensors may be positioned above the substrate to detect infrared radiation from particular substrate regions. Similarly, thermocouple sensors may be placed in thermal contact with the substrate to sense substrate temperatures at particular substrate regions. The thermocouples are preferably imbedded in the thermally-conductive heating elements.

Based on the sensor signals, a microprocessor 124 in controller 126 calculates control signals and sends them to variable power supplies 136, 138 and 140. The variable power supplies are in electrical contact with thermally-conductive heating elements 56 (FIG. 4A) and with controller 126. The variable power supplies change flows of electric current through their respective thermally-conductive heating element zones in accordance with the control signals received from microprocessor 124. Microprocessor 124 calculates and sends additional control signals to the motor or air cylinder 122 to regulate the transport of the cooling plate 62 into thermal contact with the thermally-conductive heating elements 56, if maximal cooling-rates are desired. Otherwise, microprocessor 124 adjusts the power supplies to regulate temperature solely through the thermally-conductive heating elements 56.

Figure 8:
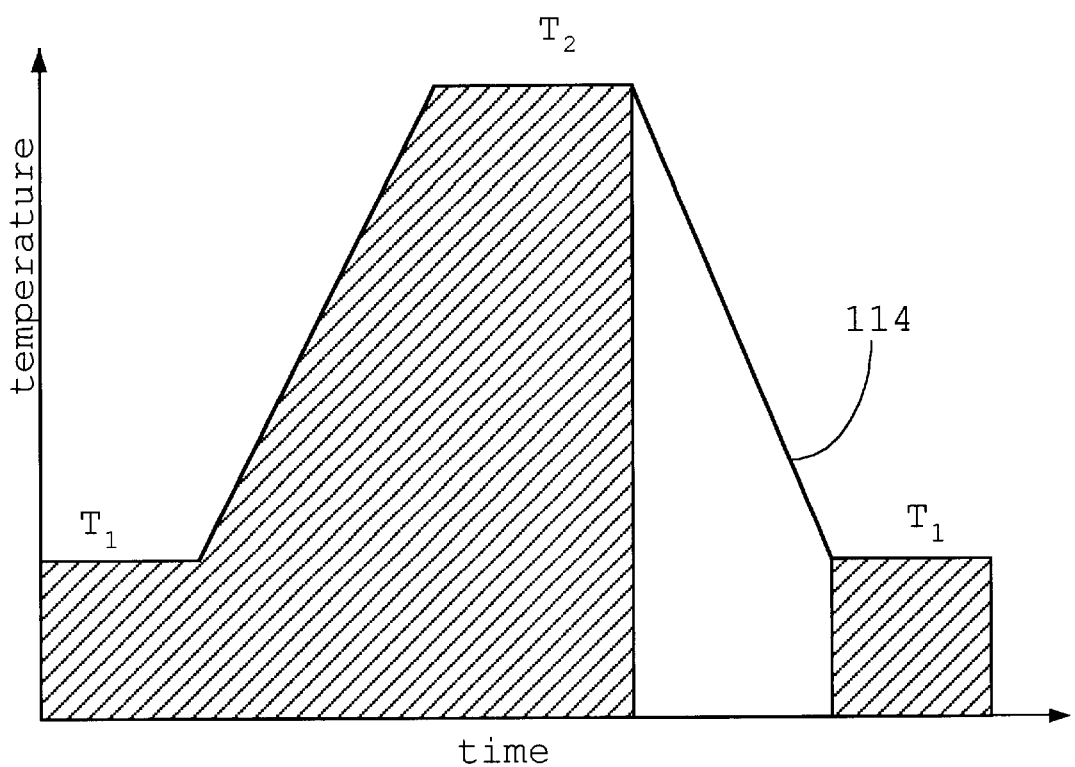
FIG. 8 is a graph showing the relationship between temperature and time in a thermal cycle executed by the photoresist processing module of FIG. 4.

In the operation of the preferred embodiment, the substrate temperature is controlled by the thermally-conductive heating elements 56. This temperature is regulated by the resistive heater 58 and by the presence or absence of thermal contact between the cooling plate 62 and the thermally-conductive heating element 56. The proper relationship to execute a thermal cycle is illustrated in the graph of FIG. 8. Curve 114 represents the desired temperature of the substrate at each time point in the thermal cycle. Thermally-conductive heating element 56 provides the necessary incremental heat to achieve the desired substrate temperatures at each point in the thermal cycle, i.e. all heat during heat-up and stabilization and the amount of heat indicated by the hatched region during cool down.

In a preferred method to operate the photoresist processing system, the bake/chill plate is initially at a low temperature $T_1$, e.g. 21° C. A substrate 10 at ambient temperature is inserted into the processing chamber and lowered into position by lift pin assemblies. The thermally-conductive heating elements are activated to rapidly heat the substrate to an elevated temperature $T_2$ of between 70° C. and 250° C. Thereafter, the power supplied to the resistive heaters is reduced to a level that is sufficient to maintain the substrate at the elevated temperature $T_2$. At the end of the process hold, the power supplied to the heating element is deactivated. If maximal ramp-down rate is needed, the cooling plate is moved into thermal contact with the backside of the thermally-conductive heating elements to lower the substrate back to temperature $T_1$. However, the preferred embodiment for the ramp-down cooling option is to leave the cooling plate in a lowered position, and remove heat via the heat conduction pathway through the shaft of the thermally-conductive heating element, into the support structure, and then to the cooling plate. In addition, a small amount of power may be supplied to the resistive heater element to achieve spatial temperature uniformity of the substrate. In addition, it may be desirable to have a cooling plate temperature sufficiently below $T_1$ to improve the cool down rate. In this case, the thermally-conductive heating elements would be activated at the tail of stabilization portion of the cool down phase in order to maintain a constant and repeatable temperature. The temperature uniformity can be improved during cool down through the use of the resistive heater elements.

The invention is clearly applicable to other sorts of thermally processed objects, such as silicon wafers, quartz photomasks, flat panel displays, and plastic work pieces. In addition, although the thermal cycling module has been described as part of a photoresist processing system, it is applicable to other integrated circuit fabrication processes, such as rapid thermal processing, chemical vapor deposition and physical vapor deposition, in which the substrate temperature must be precisely controlled.

The present invention has now been described in accordance with several exemplary embodiments, which are intended to be illustrative in all aspects, rather than being restrictive. Thus, the present invention is capable of many variations in detailed implementation, which may be derived from the description contained herein by a person of ordinary skill in the art. All such variations are considered to be within the scope and spirit of the present invention as defined by the following claims and their legal equivalents.

What is claimed is:

1. A system for thermally processing a substrate, comprising:
   a plurality of thermally-conductive heating elements in thermal contact with the substrate during processing, each thermally-conductive heating element separated from adjacent thermally-conductive heating elements by a thermally-resistive gap;
   a plurality of heaters, each of said heaters associated with one of said thermally-conductive heating elements to control the temperature of the substrate.

2. The thermal system of claim 1, wherein each of said thermally-conductive heating elements comprises a shaft.

3. The thermal system of claim 2, wherein said shafts are connected to a support structure to hold said thermally-conductive heating elements in position.

4. The thermal system of claim 3, further comprising a cooling plate resting on an upper surface of the support structure, and in effective thermal contact with each of said thermally-conductive heating elements via a heat conduction pathway through said shafts, said support structure, and said cooling plate.

5. The thermal system of claim 4, wherein said cooling plate has a passage for cooling fluid.

6. The thermal system of claim 4, wherein said cooling plate has holes for noncontact passage of said shafts.

7. The thermal system of claim 4, wherein said cooling plate is coated with a thermally conductive pad of about 5 to 10 mils thick that allows for even thermal contacts between said cooling plate, said support structure, and said thermally-conductive heating elements.

8. The thermal system of claim 4, wherein said cooling plate is connected to a lifting mechanism.

9. The thermal system of claim 8, wherein said cooling plate is mounted to an air actuated cylinder that permits vertical movement.

10. The thermal system of claim 8, wherein said cooling plate is mounted to a motor that permits vertical movement.

11. The thermal system of claim 8, wherein said lifting mechanism moves said cooling plate in and out of said effective thermal contact with a back surface of said thin upper plate.

12. The thermal system of claim 2, wherein each of said heaters comprises a resistive heating element embedded within said shaft.

13. The thermal system of claim 12, wherein each of the thermally-conductive heating elements comprises a thin upper thermal plate not appreciably affecting the thermal resistance achieved by said thermally-resistive gaps.

14. The thermal system of claim 13, wherein said resistive heating element is adhered to an upper surface of said associated thin upper thermal plate.

15. The thermal system of claim 13, wherein said thin upper thermal plate comprises a 1 inch by 1 inch square piece of 60 mils thick.

16. The thermal system of claim 13, wherein said thin upper thermal plate is sector shaped to form concentric rings arranged in a plane.

17. The thermal system of claim 13, wherein said two adjacent thin upper thermal plates are separated by a distance of between 0 and 50 mils.

18. The thermal system of claim 12, wherein said resistive heating elements are cartridge heaters.

19. The thermal system of claim 2, wherein said shaft has a cylindrical shape of 2 inches long, 0.25 inches in diameter, and a 0.125 inch hollow core.

20. The thermal system of claim 1, wherein each of said heaters is embedded within said associated thermally-conductive heating element.

21. The thermal system of claim 1, wherein said thermally-conductive heating elements form a continuous structure machined from a single starting material.

22. The thermal system of claim 1, wherein each of said thermally-conductive heating elements has an embedded temperature sensor.

23. The thermal system of claim 1, further comprising a multivariable feedback controller for automatically adjusting a heater power of each of said heaters in response to a temperature measurement.

24. The thermal system of claim 1, wherein said thermally-resistive gap comprises an air gap.

* * * * *